United States Patent
Cheong et al.

[11] Patent Number: 6,055,463
[45] Date of Patent: Apr. 25, 2000

[54] CONTROL SYSTEM AND METHOD FOR SEMICONDUCTOR INTEGRATED CIRCUIT TEST PROCESS

[75] Inventors: Kwang Yung Cheong; Ann Seong Lee; Jae Young Kim, all of Cheonan, Rep. of Korea

[73] Assignee: Samsung Electronics Co. Ltd., Suwon, Rep. of Korea

[21] Appl. No.: 09/080,192

[22] Filed: May 18, 1998

[30] Foreign Application Priority Data

May 20, 1997 [KR] Rep. of Korea ............... 97-19601

[51] Int. Cl.[7] .......................... B07C 17/00; G06F 17/00; G07F 7/00
[52] U.S. Cl. .......................... 700/223; 700/109; 700/115; 700/121; 209/571; 209/573; 702/81; 702/82; 702/83; 702/84
[58] Field of Search .................. 209/571, 573, 209/574; 702/81, 82, 83, 84; 395/500.05; 700/223

[56] References Cited

U.S. PATENT DOCUMENTS

| | | | |
|---|---|---|---|
| 5,396,433 | 3/1995 | Kosugi | 364/468.28 |
| 5,400,263 | 3/1995 | Rohrbaugh et al. | |
| 5,538,141 | 7/1996 | Gross, Jr. et al. | |
| 5,589,765 | 12/1996 | Ohmart et al. | |
| 5,761,064 | 6/1998 | La et al. | 364/468.17 |
| 5,787,021 | 7/1998 | Samaha | 364/468.16 |
| 5,828,578 | 10/1998 | Blomgren | 364/468.28 |
| 5,865,319 | 2/1999 | Okuda et al. | 209/571 |
| 5,895,443 | 4/1999 | Gross et al. | 209/573 |

FOREIGN PATENT DOCUMENTS

WO 97/05497  2/1997  WIPO.

*Primary Examiner*—Christopher P. Ellis
*Assistant Examiner*—Joe Dillon, Jr.
*Attorney, Agent, or Firm*—Jones Volentine, L.L.P.

[57] ABSTRACT

A test control system for controlling overall test procedures which processes test data generated from the final test process and analyzes bin category results. The control system uses testers for testing electrical characteristics of IC devices, a host computer for processing data transmitted from the testers and for creating a number of database structures, and distributed computers for monitoring the test progress and analyzing the test results using the database structures stored in the host computer. A control method using the control system includes the steps of: performing a final test as a lot; monitoring the status of the final test progress while storing test data during the final test; determining if the final test is completed; performing a lot decision after the final test is completed based on bin category limits; and displaying the lot decision result and storing the test data. The lot decision is based upon any bin category having a bin capacity exceeding its bin category limit by greater than a certain predetermined value even though the lot meets the yield requirement. As a result, the control system can detect an abnormal lot more easily than a system in which the lot decision is based only on yield.

9 Claims, 10 Drawing Sheets

CONTROL SYSTEM AND METHOD FOR SEMICONDUCTOR INTEGRATED CIRCUIT TEST PROCESS

BACKGROUND OF THE INVENTION

1. Field of the Invention

The present invention relates to testing of integrated circuit devices. More particularly, the present invention is directed to a control system and a control method for controlling test procedures by processing test data generated from the test procedures and analyzing the test data.

2. Background of the Related Art

In general, semiconductor IC devices are fabricated via hundreds of processing steps, and must be subjected to a variety of test processes to verify their electrical function, performance, and reliability prior to shipment. The test processes include, among others, a final test and a quality assurance (QA) test. In the final test, all of the IC devices that have passed through the wafer fabrication steps and assembly processing steps are tested and sorted into good or failed devices. The final test may be performed on a number of identical IC devices manufactured under the same processing environment, for example, up to two thousand devices at once.

According to the results of the final test, the IC devices are classified in certain bin categories. For example, IC devices classified as BIN 1 (i.e., bin category 1), have experienced no failures and are thus regarded as good or passed devices, while IC devices classified as BIN 7 (i.e., bin category 7) are regarded as defective devices with the main cause of failure being excessive leakage current. Of course, any number of bin categories and bin numbering systems may be employed depending on the semiconductor manufacturer and the nature of the IC devices to be tested. For example, other bin categories could accommodate failures due voltage or current being outside an acceptable range, open/short failures, or differing memory access times.

The QA test is used to confirm the results of the final test and to assure the quality of the devices requested by specific customers by testing predetermined numbers of devices sampled from the good devices (e.g., BIN 1 devices) that have passed the final test. After passing the QA test, the good devices are delivered to the customers.

Present day semiconductor markets call for multiple species of small quantity, high technology and short life cycle devices. Due to the short life cycle and specialized nature of the devices, manufacturers who develop and sell new IC devices require the ability to quickly set-up the production lines, as well as have fast, accurate analysis of the causes of failures so as quickly correct defects in the production line. Furthermore, the time required for testing should also be reduced as much as possible without sacrificing quality or reliability. To do so, the manufacturers need to control the overall test procedures and to integrally manipulate test data. In order to stabilize the product lines and produce high quality devices, failure analysis and test data should be made readily available to the designers and production personnel so that changes may be reflected in circuit design, wafer fabrication, and assembly steps.

SUMMARY OF THE INVENTION

The present invention provides a control system and control method which: improves the efficiency of the test process; reduces test time; accurately analyzes test data and stabilizes the production lines; bypasses the QA sampling test by using test data of the final test; and efficiently controls the final test procedure by analyzing test results in real time during the final test.

To achieve these and other advantages, the present invention provides a control system for controlling the test processes of IC devices. The control system includes testers for testing plural electrical characteristics of the IC devices, a host computer for processing data transmitted from testers and for creating a number of databases structures in the host computer memory, and distributed computers for monitoring the test progress and analyzing the test results using the database structures stored in the host computer.

The database structures stored in the host computer include a lot decision database for determining the subsequent flow path of a tested lot after a final test, a test progress monitoring database and a test data analysis database. The lot decision database includes a test program name, a lot number, and the number of IC devices sorted into each of the bin categories based on the test sequences performed by the testers. The test progress monitoring database includes a tester name, a test mode, a lot size, total count, total failed devices, good devices, open/short failures, and the other failures. The test data analysis database includes a device name, a test program name, a test board identification, a test start time, a lot size, total count, total failed, and the number of IC devices sorted into each of the bin categories.

A control method of the present invention comprises the steps of: setting up IC devices to be tested and loading test programs; performing a final test by lot; monitoring the progress of the final test while storing test data during the final test; determining if the final test is completed; performing a lot decision after the final test is completed based on the bin category limits established by a bin category limit determining sequence; displaying the lot decision result and storing the test data; requesting an incoming inspection according to the lot decision result; and performing Q/A monitoring.

In the lot decision sequence of the present invention, it is determined if any bin category exceeding their bin category limit is greater than a certain predetermined value even though the lot meets the yield requirement. All test data generated during the final test are stored into a central host computer according to the bin category so that the test data can be readily compared with their bin category limits.

For setting the bin category limits, various criteria are applied depending on whether the bin categories are related to the yield requirement of the devices (e.g., BIN 1), to the electrical characteristics (e.g., open/short failures or leakage current), or to other characteristics of the IC devices. The bin category limits should be defined on the basis of the number of good or passed devices in a lot having a yield ranging from 95% to 100%, and the bin category limits should be set only after a sufficient number of lots have been tested and a certain amount of test results have been stored. Further, the bin category limits are applied differently depending on the ratios of failed devices to their corresponding bin category.

BRIEF DESCRIPTION OF THE ATTACHED DRAWINGS

The accompanying drawings, which are included to provide a further understanding of the invention and are incorporated in and constitute a part of this specification, illustrate an embodiment of the invention, in which.

DETAILED DESCRIPTION OF PREFERRED EMBODIMENT

Figure 1:
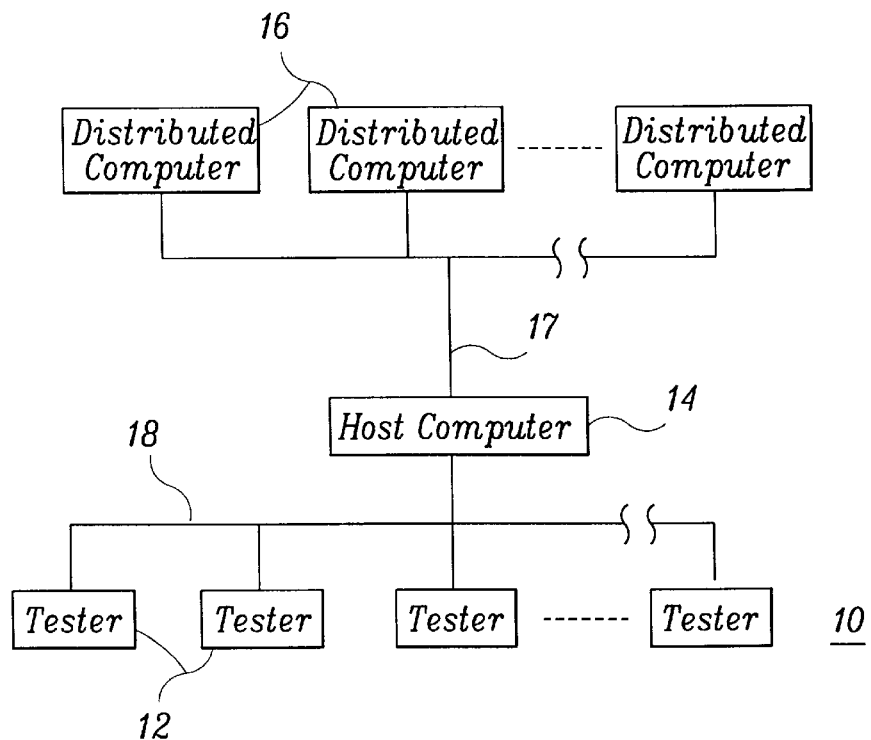
FIG. 1 is a schematic block diagram of a test process control system of the present invention.

FIG. 1 shows a test process control system according to the present invention. A plurality of testers 12 are connected to a host computer 14. The host computer 14 may be a computer system using a UNIX or VAX operating system. The UNIX system is preferable since it is compatible with personal computers.

The testers 12 are connected to the host computer 14 through a network 18. If implemented as a local area network (LAN), an Ethernet or other suitable network may be used. An Ethernet LAN provides a low cost and easily expandable network. The Ethernet is a 10-megabit baseband local area network that allows multiple stations (e.g., several hundred) to access the transmission medium at will without prior coordination. When the testers are separated by an appreciable distance from the host computer, a telecommunication network using telephone lines can be used.

A plurality of distributed computers 16 are used to analyze the test data and send alarm messages to the test operator in case of abnormal situations. The distributed computers 16 are connected to the host computer 14 by a network 17. The distributed computers 16 may be personal computers or workstations. Like the network 18, the network 17 can be implemented as an Ethernet or a telecommunication network using telephone lines.

Figure 2:
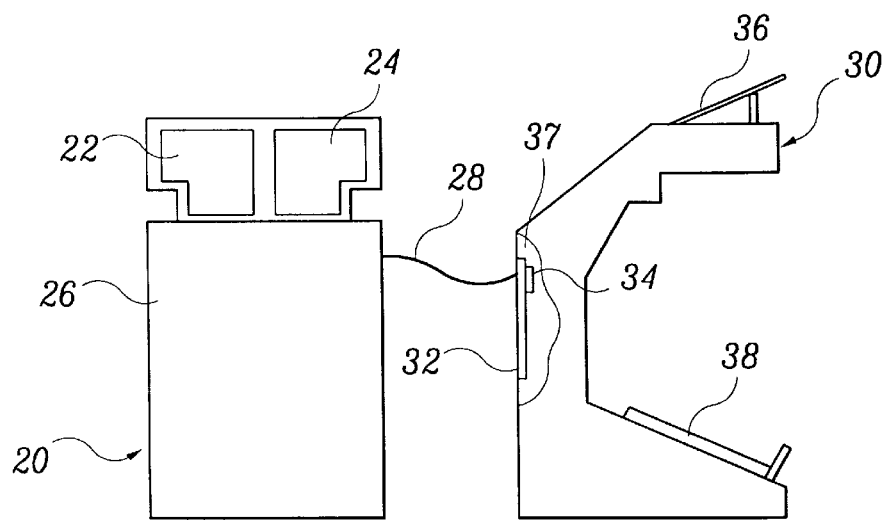
FIG. 2 is a schematic diagram of a tester for testing IC devices.

The tester 12 is provided with a main test body 20 and handler 30 as shown in FIG. 2. The handler 30 comprises a device loading part 36 for automatically and sequentially loading IC devices to be tested, and a testing part 37 where a test board 32 is fixed. The test board 32 has predetermined circuit patterns and is electrically connected to the main test body 20 via cables 28. A sorting part 38 sorts the tested devices according to bin category based on the results of the test sequences.

The main test body 20 comprises a test head 26, which has a number of modules for applying sequences of test signals to the IC device 34 mounted onto the test board 32 and for measuring output signals from the device 34. A microprocessor 22 controls the test head 26 according to a predesigned test program, and an input-output unit 24 provides data communication between the operators and the main test body 20. The input-output unit 24 may comprise, for example, a key board, a display unit, and an alarm signal generator.

During the test, the tester 12 transmits test data to the host computer 14 through the network 18. The tester 12 also controls the set-up of IC devices 34 to be tested by receiving instructions from the host computer 14, and requesting a lot decision from the host computer 14 when final testing of a lot is completed. Based on the lot decision of the host computer 14, the tester 12 provides the results to the operator through the input-output unit 24.

The host computer 14 comprises a memory containing database structures formulated from the test data transmitted from the testers 12. The host computer 14 and sends an alarm signal to the distributed computers 16 when an abnormal situation has occurred during the final test. The host computer 14 determines the subsequent path of the tested lot according to a lot decision sequence described later.

Figure 3:
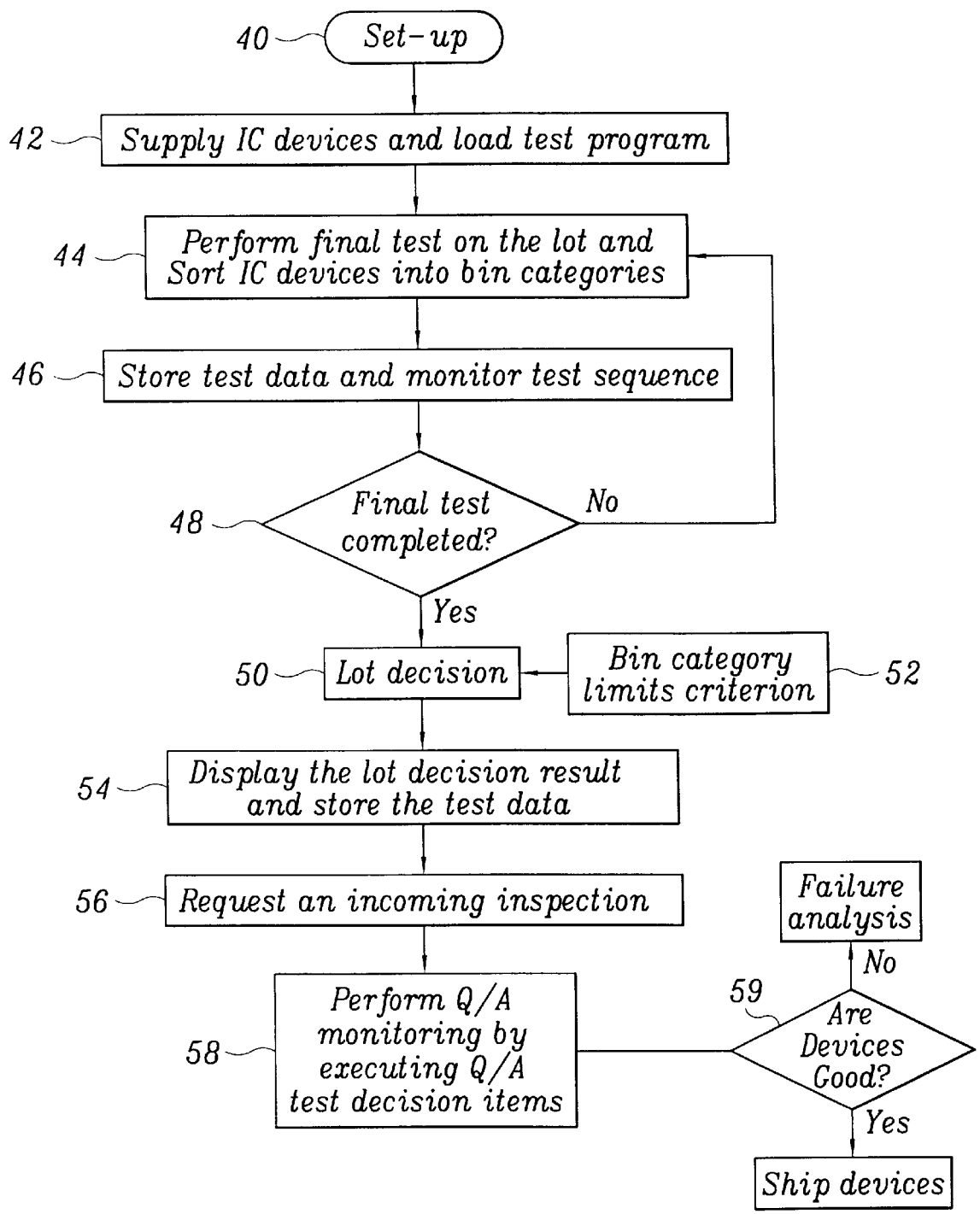
FIG. 3 is a flow diagram of a test process control method of the present invention.

FIG. 3 shows a sequence of the control method for test processes according to the present invention as described in FIGS. 1 and 2. In a set-up step 40, a number of testers 12 are set-up and IC devices 34 to be tested are identified by lot. After the testers 12 are set-up, in step 42 the host computer 14 loads test programs to corresponding testers 12, and IC devices 34 to be tested are sequentially supplied to the testing part 37 of the handler 30. The test program is developed and programmed by the operators depending on the device characteristics and test items and then stored in the host computer 14. The programming language for the test program may be either a specific or proprietary programming language provided by the tester manufacturers, or an adaptation of general programming languages such as C, C++ or other compiled languages.

Tester lists and device lists are stored in the host computer 14. In accordance with the tester lists, device lists, and test programs, the host computer 14 selects and loads the test program to the selected tester 12 automatically or by manual intervention of the operators.

After the supply and loading step 42, the tester 12 performs the final test by applying various test signals to the IC devices 34, measuring the output signals from the IC devices 34, and sorting the tested IC devices 34 in bin categories according to test results (step 44). As stated above, identical IC devices 34 produced under the same processing circumstances are supplied to the tester 12 as a lot and the final test is also carried out on the devices as a lot.

Test data produced during the final test are transmitted to and then stored in the host computer 14 in real time. The progress of the final test is monitored by the host computer 14 and the distributed computers 16 (step 46). During the final test progress monitoring step 46, the status of the final test sequence (i.e., how much it has progressed) is provided to the operators. When an abnormal situation has occurred during the final test, alarm messages are sent to the operators by the distributed computers 16 via the input-output unit 24 of the tester 12.

In step 48, it is determined whether the final test of a lot is completed, and if so, the host computer 14 makes a lot decision, based on the stored test result data.

In the lot decision step 50, bin category limits as determined by a bin category limit determining sequence 52 of the present invention are used. The bin category limit determining sequence 52 will be described in greater detail later in the specification. The subsequent flow path of the tested lot is decided by analyzing the bin category results and comparing the bin category results with the upper and the lower limits of the bin category. This lot decision step has, as explained later, distinguishing features from the conventional lot decision scheme in which causes of failure are analyzed only when the tested lot does not satisfy a predetermined yield, e.g., 95%.

In step 54, the results of the lot decision of step 50 are displayed to the operators, and the final test result data are stored in different memory locations in the host computer 14 depending on the lot decision. An incoming inspection for quality assurance of the tested lot is requested in step 56, and then a QA monitoring step 58 may be carried out, depending on the lot decision in step 50.

The QA monitoring step 58 in the present invention is thus different from the conventional QA test. Recall that the conventional QA test always samples the finally tested IC devices 34 and conducts QA tests to assure the quality of the good or passed IC devices shipped to the customer. However, as stated above, in the present invention performance of the QA monitoring (step 58) on the lot after the final test depends upon the lot decision in step 50. For example, when the tested lot meets a predetermined yield and there are no violations of the bin category limits, the QA sampling test may be omitted, with the number of IC devices 34 tested and contained in the lot being simply counted.

In step 59, good IC devices will be shipped to the customer. If the tested IC devices do not meet the yield requirement and are found to have some bin category limit violations, the causes of failure are analyzed using the test result data stored in the host computer 14. The failure analysis results are used to timely adjust the wafer fabrication and assembly steps to correct the defects and enhance the yields.

Figure 4:
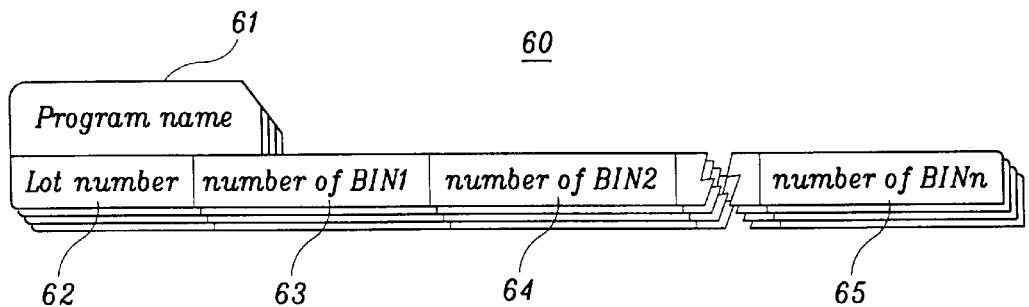
FIG. 4 shows a database structure suitable for use in a lot decision sequence according to the present invention.
Figure 5:
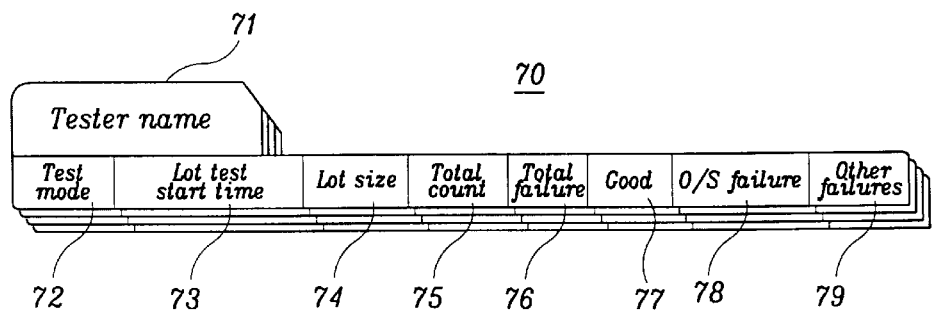
FIG. 5 shows a database structure suitable for use in monitoring the final test according to the present invention.
Figure 6:
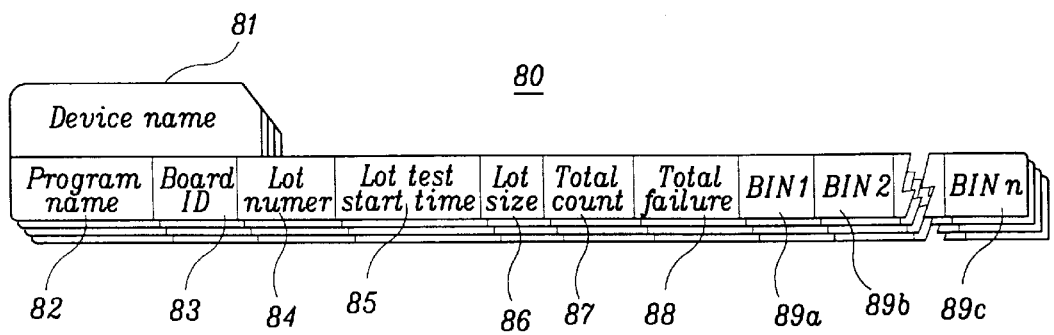
FIG. 6 shows a database structure suitable for use in data analysis according to the present invention.

In the present invention, the database structure is designed to facilitate processing of the test data obtained during the final test procedures. FIGS. 4 to 6 show exemplary database structures suitable for use in the present invention. Database structure 60 as shown in FIG. 4 is for the lot decision (step 50 in FIG. 3) and uses a test program name as a file name or a database table name. The lot number in field 62 is entered by an operator through the input-output unit 24 at the beginning of the final test. The number of IC devices sorted into certain bin categories (i.e., BIN 1 to BIN n) are stored in fields 63, 64, and 65 in the database 60. Upon receiving a final test completion signal from the testers 12, the host computer 14 checks the program name 61 and the lot number 62, and then compares the number of IC devices sorted into BIN 1 to BIN n with their respective bin category upper and lower limits determined by the bin category limit determining sequence. Depending on the comparison result, the host computer 14 performs the lot decision (step 50 in FIG. 3) in view of the bin category limit criterion (step 52 in FIG. 3) and then sends the lot decision result to the testers 12. For example, even when the yield requirement is met, i.e., the number of BIN 1 devices is over 95% of the number of IC devices contained in a lot, the lot is not considered good if a certain bin categories exceeds a bin category limit, e.g., 3% of the lot size. In this case, the IC devices will be subject to either a follow-on sampling test, a production reliability test, or to data analysis of the bin category data.

FIG. 5 shows an exemplary database structure for monitoring the final test process of the present invention. The fields of database structure 70 are identified by the tester name 71. A test mode in field 72 represents the present status of the tester 12 (e.g., under the final test, under the sampling test or in a pause state), and identifies the users or the operators. A start time of the lot test in field 73 indicates the time when the final test of a specific lot starts, and a lot size in field 74 means total number of IC devices contained in a lot. A total count in field 75 denotes the number of IC devices actually counted by a tester 12 during the final test. When the lot size field 74 is not identical to the total count field 75, the final test is repeated or the sampling test is performed with twice as many sampled IC devices as usual.

In the database structure 70 of FIG. 5, the quantity of failed devices in field 76 and the quantity of good devices in field 77 are determined by the numbers of IC devices sorted into BIN 1 and any other BINs. The quantity of defective devices which suffered contact failures is stored as O/S (Open/Short) failure data in field 78. An O/S failure may occur at a variety of locations, including the contacts between the test board 32 and the leads of IC devices 34, the connection between the test board 32 and the test head 26, the connection between the test board 32 and the handler 30, or perhaps the interconnections between bonding wires and electrode pads of the IC device itself. In other words, the O/S failure has no relationship to the electrical characteristics of the IC device being tested. The other failures in field 79 are related to the electrical characteristics of the IC devices and therefore vary depending on the test items and the devices.

The database structure 70 for monitoring the final test process should be updated whenever the host computer 14 receives related data from the tester 12 during the final test, and the updated data are displayed in real time so that an operator or an adviser can observe the continuing status of the final test process.

FIG. 6 shows an exemplary database structure for the data analysis feature of the present invention. The data analysis database structure 80 uses an IC device name 81 as a file name or a database table name. The host computer 14 classifies test data generated from a plurality of testers 12 according to the tested IC devices and the lot whenever a certain time period has passed. The program name in field 82 identifies a test program for the final test, and a board ID in field 83 denotes the identification number of a test board mounted onto the handler 30 of a tester 12. The data analysis database structure 80 also contains the lot number in field 84, the lot test start time in field 85, the lot size of the IC devices in field 86, and the total count of IC devices in field 87. The quantity of failed IC devices sorted into each of BINs 1 to n are stored in fields 89a, 89b, and 89c.

This database structure 80 can be used to monitor any changes or variations of the final test results depending on time, tester, test board, lot and operator. In the test result analysis, this database structure 80 provides fundamental data for statistical analysis of the test process or for comparing the test data with the bin category limits after bin category data are stored.

Figure 7:
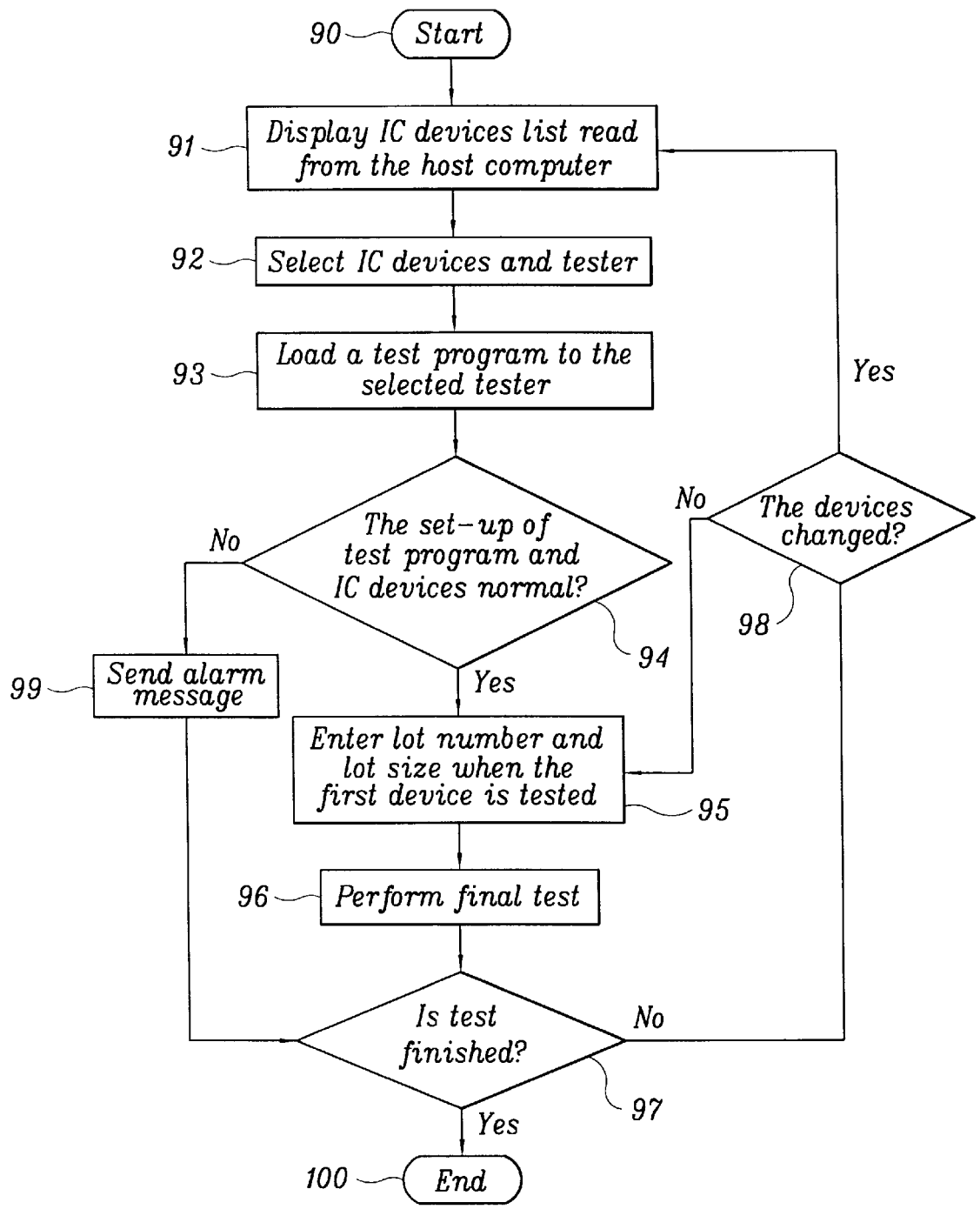
FIG. 7 is a flow diagram of a test program set-up sequence.

FIG. 7 is a flow diagram of a test program set-up sequence in accordance with the present invention. In the start step 90, electrical power is supplied to the tester 12, whereby the tester is set-up and enters a stable state. The host computer 14 reads the list of IC devices to be tested and displays it through the monitor of the distributed computer 16 so that the operator can see the list (step 91). The operator selects the IC devices and the tester 12 for testing the IC devices (step 92). The host computer 14 chooses and loads a test program to the selected tester 12 (step 93). In step 94, the set-up of the test program and the IC devices is checked, and if the set-up is normal, the operator enters the lot number and the lot size when the first IC device is to be tested (step 95), after which the final test is performed (step 96). The lot number and the lot size are used to construct the database structures as described above with reference to FIGS. 4, 5 and 6.

On the other hand, if the set-up of the test program and the devices is determined to be abnormal at step 94, an alarm message is sent at step 99 to prompt the operator to find and solve the problem.

In step 97, it is determined whether or not the final test is finished. If the answer at step 97 is yes, then the process flows to end at step 100. However, if the answer at step 97 is no, and the test is to be continued, then the process flows to step 98 in which it is determined whether or not the IC devices are changed. If the devices are not changed (such as after the alarm is sent in step 99) and the set-up is corrected, the flow path is returned to step 95 where the operator enters the lot number and lot size. Thereafter the final test is performed (step 96). If the devices are changed, the final test must be performed on this new lot and thus the flow path is returned to step 91 so that the operator can select other devices and a tester 12 displayed on the monitor of the distributed computer 16.

Once the final test is finished and the process reaches end at step 100, the monitoring process of the final test is performed.

Figure 8:
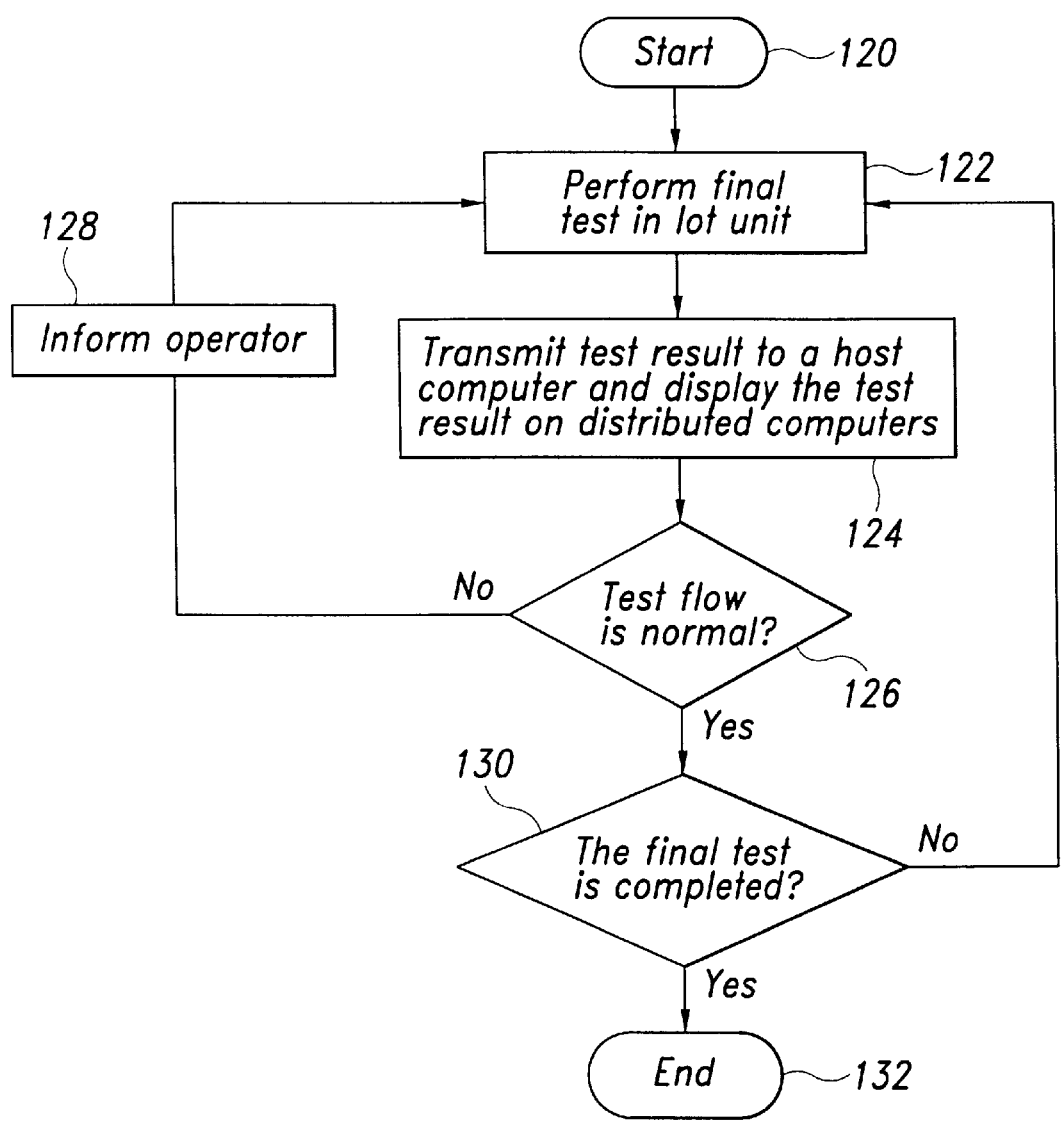
FIG. 8 is a flow diagram of a final test monitoring sequence of the present invention.

FIG. 8 is a flow diagram of a final test monitoring sequence of the present invention. The monitoring of the final test serves two purposes: supervising the work flow of the final test; and informing the operator of an abnormal situation in real time. In the start step 120, the preparation for final test is completed, and a lot of IC devices are provided and tested to confirm their electrical characteristics in step 122. Test result data generated during the final test is transmitted to a host computer 14 and displayed on the distributed computers 16 (step 124). The host computer 14 analyzes the test result data and decides if the test flow is proceeding along an intended path (step 126). When an abnormal situation has occurred, the host computer 14 informs the operator in step 128, and when no problem is found, the final test is continued. For example, the host computer 14 calculates the open/short failure ratio for the test procedure, and if open/short failures are subsequently found, the host computer 14 automatically stops the final test and instructs the operator to check the contacts of test boards and handlers.

In step 126, data such as bin category data generated during the final test, the data input in the test program set-up step, and the lot test start time, are transmitted to the host computer 14 so that an operator can ascertain the present condition of the tester 12 in operation and the interim test result.

In step 130, a decision is made concerning whether or not the final test is completed. If the test is to be continued, the process returns to step 122, but if the final test is completed, the process flows to end at step 132 and the tester 12 sends a test complete signal to the host computer 14 and requests a lot decision from the host computer 14 (see FIG. 3).

For the lot decision, predetermined bin category limits are used. Since the bin category limits have a great effect on the reliability of the lot decision results, the bin category limits should be carefully determined based on such parameters as capacity of a test process, capacity of management of operators or test engineers, and the failure ratios of the bin categories.

Figure 9:
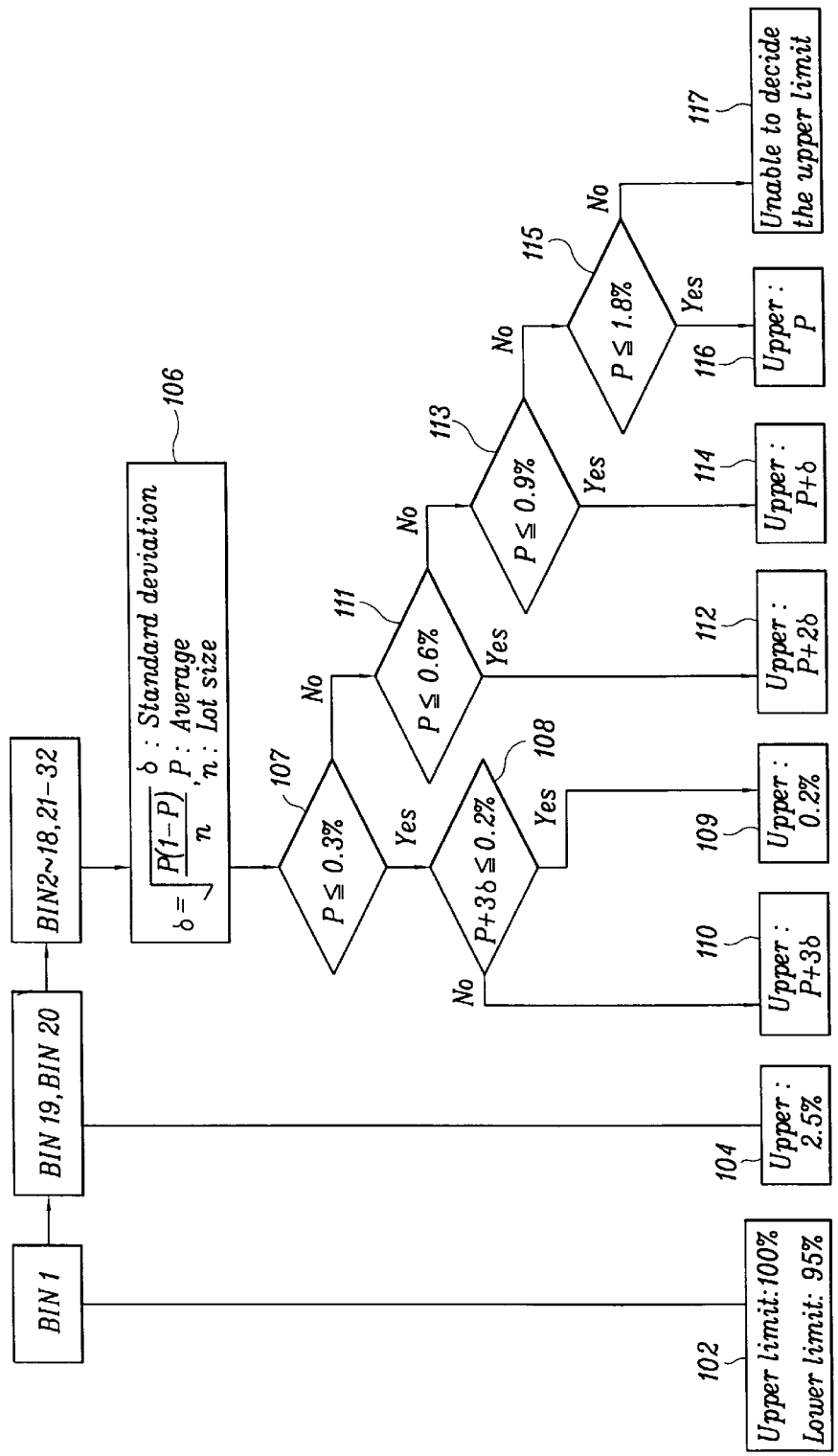
FIG. 9 is a flow diagram of a bin category limit determining sequence of the present invention.

FIG. 9 is a flow diagram of a bin category limit determining sequence of the present invention. One of ordinary skill in the art would understand that the bin categories (BINs 1–32) and reference ratios/values such as 95%, 0.2%, 0.3%, 0.6%, 0.9%, and 1.8% of FIG. 9 are merely illustrative of the limit determining sequence, and should not be construed as limited to these specific categories or ratios. In FIG. 9, the bin categories are divided into BINs 1 to 32, in which the BIN 1 category indicates that all of the tested IC devices satisfy and pass every test item, and BINs 19 and 20, respectively, represent open and short failures. The remaining BIN categories indicate various failures related to the electrical characteristics of the tested IC devices. For illustrative purposes, the various failures are explained with reference to an IC device manufactured by the assignee of the present application, model no. KS911B. The KS911 B device is a logic device used in a compact disk player, and functions to transfer data between the disk and a loud speaker. In the test items for the KS911B device, the test sequence associated with BIN 3 tests for input/output failures, and the test sequence for BINs 4 and 5 tests for proper low voltage operation. BINs 7 and 8 are related to leakage tests, BIN 14 to stand-by current ($I_{DS}$) tests, BIN 15 to operational current ($I_{DD}$) tests, and BIN 16 to the SRAM (Static Random Access Memory) function of the device.

First, the upper and lower limits of the BIN 1 category are set to be 100% and 95%, respectively (step 102), which means that if the IC devices binned out as BIN 1 are equal to or greater than 95% of the lot size, the IC devices meet an intended yield condition, and mass production of the IC devices is possible. The upper limit 100% of the BIN 1 category is necessary to determine whether the number of tested IC devices is identical to the number of IC devices (lot size) provided to a test. If some IC devices are tested twice, the number of IC devices sorted into BIN 1 can be greater than the upper limit of 100%, which means special handling and management of this lot required.

The upper limits for BINs 19 and 20 for the open/short failure are set to be 2.5% (step 104), and the limits of the remaining BINs are determined by the following steps. After testing a sufficient number of lots to ensure reliability of the data, an average number 'P' of IC devices sorted into a particular BIN category is found, and then the standard deviation 'σ' is calculated using the average number 'P' and the lot size 'n' by the following equation (step 106):

$$\sigma = \sqrt{\frac{P(1-P)}{n}}$$

After finding the standard deviation, it is determined whether each of the average number 'P' of the remaining bin categories (except BINs 1, 19 and 20) is over 0.3% of the lot size (step 107). If the average is equal to or less than 0.3%, it is determined whether 'P+3σ' is equal to or less than 0.2% of the lot size (step 108). When 'P+3σ' is equal to or less than 0.2%, the upper limit of the corresponding BIN category is set at 0.2% (step 109), while if 'P+3σ' is greater than 0.2%, the upper limit for the BIN category is set at 'P+3σ' (step 110).

However, if the average 'P' is found to be greater than 0.3% in step 107, it is determined whether the average 'P' is equal to or less than 0.6% of the lot size (step 111). If the average 'P' is less than or equal to 0.6%, 'P+2σ' becomes the upper limit of the BIN category (step 112). If the average 'P' is greater than 0.6%, it is determined whether the average 'P' is greater than 0.9% of the lot size in step 113. If the average 'P' is less than or equal to 0.9%, the upper limit of the corresponding BIN category is set to be 'P+σ' (step 114). If the average 'P' is greater than 0.9%, it is determined whether the average 'P' is equal to or less than 1.8% of the lot size (step 115). If the average 'P' does not exceed 1.8%, the average 'P' is set to be the upper limit of the corresponding bin category (step 116). However, if the average exceeds 1.8%, it is decided that the upper limit cannot be set, because this bin category limit is too great to obtain a lot decision (step 117). When the upper bin category limit cannot be set, the test results are analyzed to find the causes of the failures in order to remedy the failures.

The host computer 14 automatically and periodically generates the bin category limits using the bin category limit determining sequence of the present invention. The determination of the bin category limits follows decision rules prepared in consideration of the capability of management of operators and test engineers, and the average values of bin category results having a binomial distribution of the average 'P'. The decision rule contains the following items. First, control limits or bin category limits should be applied differently according to the failure ratio of the test results for each bin category. Second, a good lot is defined as a yield ranging from 95% to 100%. Third, the bin category limits are only determined after a sufficient number of lots are tested to ensure reliable data. For instance, the bin category limits may be decided only after data representing fifty lots which meet the yield requirement are collected for six months. Finally, the bin category limits should be revised periodically after new test data are stored.

In the bin category limit determining sequence described above, five reference ratios/values, i.e., 0.3%, 0.2%, 0.6%, 0.9%, and 1.8% are used. However, the reference ratios can be changed depending on the IC devices, test items, and acceptance level of test results.

Figure 10:
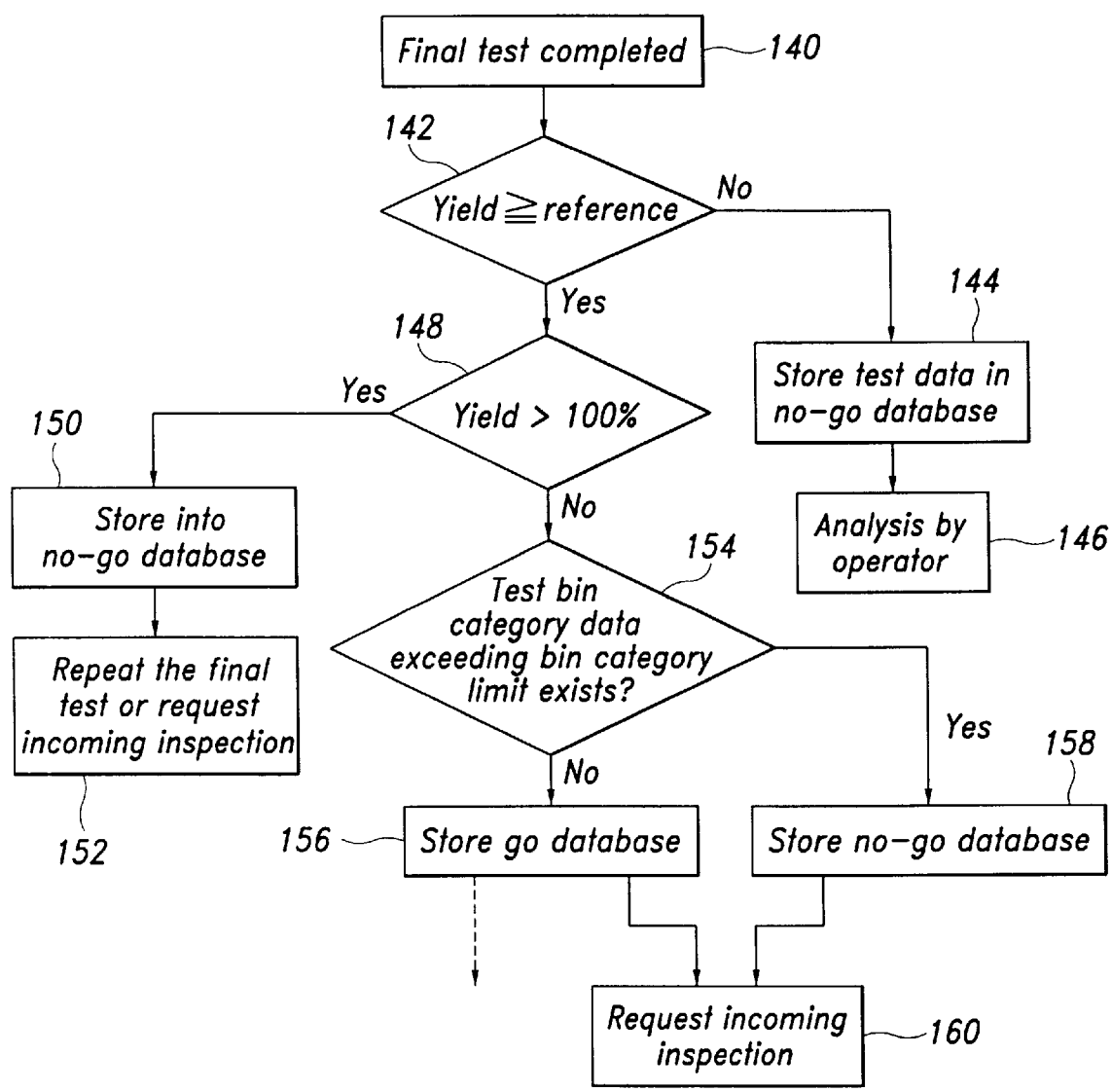
FIG. 10 is a flow diagram of a lot decision sequence of the present invention.

Recall that a lot decision is made on a lot which has completed final testing using the bin category limit determining sequence. FIG. 10 is a flow diagram of the lot decision sequence of the present invention. In the conventional IC test process, operators count the number of IC devices sorted into BIN 1 and determine if the yield requirement is met. If the yield is poor, the operators decide that this lot has failed and analyze the causes of failure. On the other hand, in the present invention, the lot decision sequence uses test result data produced during the final test and is automatically performed by the host computer 14 using the lot decision sequence of the present invention, so that the result of the lot decision can be known immediately after the final test. Further, according to the present invention, decision items and bin category limits are optimally chosen to allow for early detection of an abnormal lot. Moreover, the lot decision sequence of the present invention is not based solely on the yield data, but is based upon every bin category, so that failure detection can be improved. Corrective action resulting from the failure data can then be readily incorporated in the wafer fabrication and assembly processes.

As shown in FIG. 10, when the final test is completed (step 140), it is first determined whether the yield meets a predetermined requirement, e.g., 95% of the lot size (step 142). The yield decision is conducted by counting the number of IC devices sorted into the BIN 1 category. If the yield requirement is not met, the test data which are generated in the final test and controlled by the host computer 14 are stored into a no-go database in step 144. With respect to this lot, in step 146, the operators analyze and find the causes of the failures by using a data analysis tool which will be explained in greater detail later.

When the lot passes the yield decision step 142, it may be determined that the yield exceeds 100% of the lot size in step 148. A yield greater than 100% means that more IC devices were tested than were provided to the tester 12, and therefore test data for this lot are stored into the no-go database (step 150). This lot is either re-tested or an incoming inspection is requested for this lot (step 152). When the re-test of the lot exceeding 100% yield requires too much time, a sampling test using twice the normal sample size can be performed in a subsequent quality assurance test.

When the yield meets the predetermined requirement and does not exceed 100%, it is determined whether any bin category data from the test results exceeds the corresponding bin category limits as determined by the bin category limit determining sequence of the present invention (step 154). If none of the bin category test data departs from the corresponding bin category limits, the test data are stored into a go database (step 156). If there are bin category test data exceeding the corresponding bin category limits, the test data are stored into the no-go database (step 158) and then the corresponding lot is subjected to an incoming inspection (step 160). If desired, for added assurance, the incoming inspection (step 160) may also be performed after the test data are stored into the go database (step 156), otherwise, the incoming inspection may be skipped.

Here, the go database and the no-go database correspond to particular directories located in a memory device of the host computer 14, and have all the data elements for formulating the database structures explained with reference to FIGS. 4 to 6. For example, the go database and the no-go database contain data elements such as the test program name, the lot number, the number of IC devices sorted into the bin categories, the tester name, the test mode, the lot test start time, the lot size, the total count, the number of good devices, the number of failed devices, and the test board identification.

Figure 11:
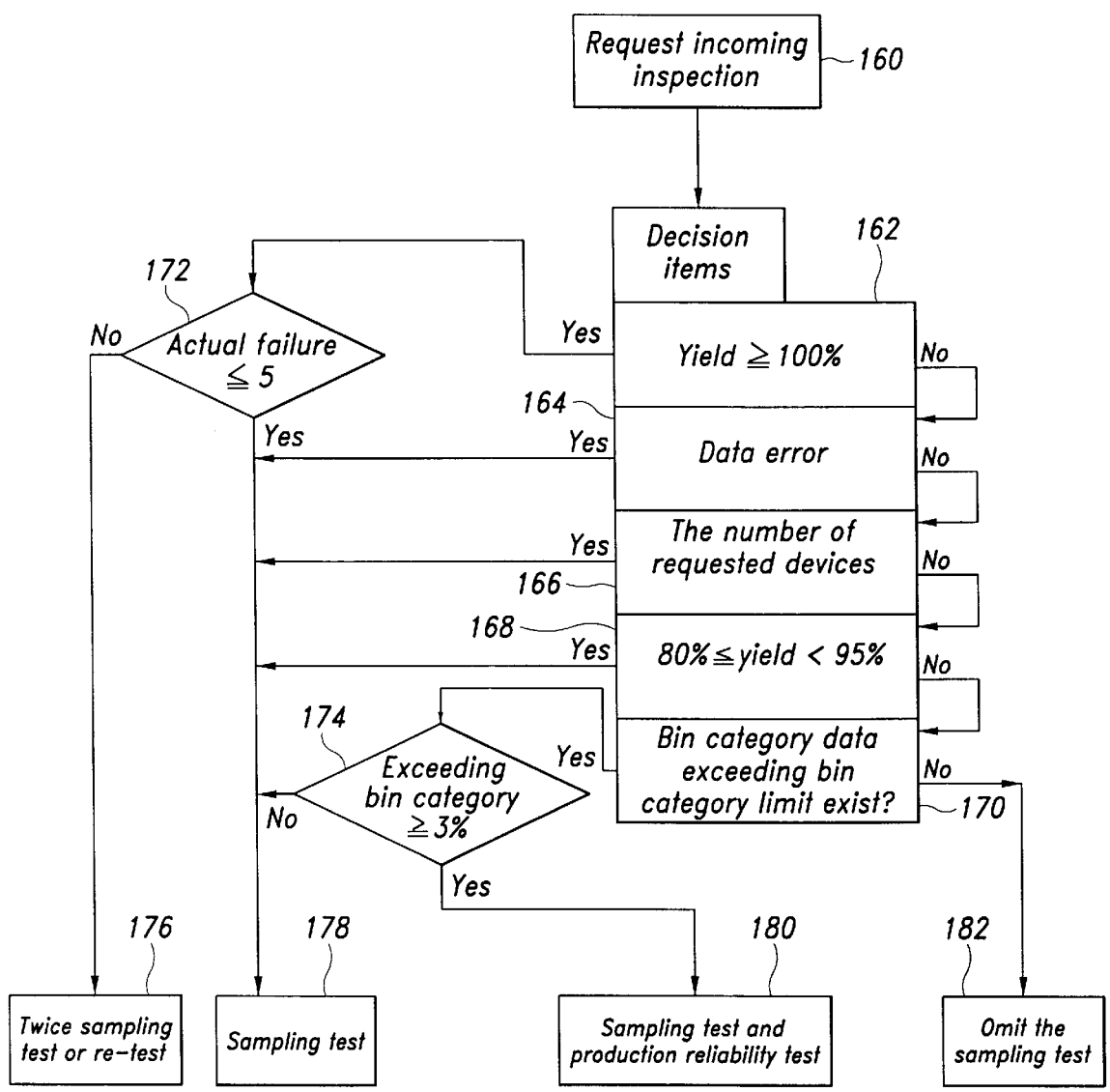
FIG. 11 is a flow diagram of a QA monitoring sequence of the present invention.

FIG. 11 is a flow diagram of a QA monitoring sequence of the present invention. The QA monitoring sequence is used to determine the next sequence of a lot for which an incoming inspection has been requested according to the lot decision results. The items of the lot decision include: if the yield exceeds 100% (step 162); if there is an error in the test data (step 164); if the number of devices in the incoming inspection requested lot is correct (step 166); if the yield is equal to or greater than 80% and less than 95% (step 168); and if there are any bin category test data exceeding the bin category limits (step 170).

The determination of whether the yield exceeds 100% can be done by comparing the ratio of the number of good or passed IC devices in BIN 1 to the lot size. When the yield is greater than 100%, it is then determined whether the number of actual failed IC devices is equal to or less than a predetermined number, in this case 5. At this time, the actual failed devices can be counted by subtracting the number of IC devices which are requested for the incoming inspection (i.e., the number of IC devices sorted into BIN 1) from the lot size (i.e., the number of total IC devices contained in a lot). In the illustrated embodiment, if the number of actual failed devices exceeds five, the next step is either to retest the corresponding lot or to perform a sampling test using twice the normal sampling size ("twice sampling test") (step 176). For example, if the lot size is two thousand IC devices, then two hundred thirty-two (232) IC devices would be sampled in the "twice sampling test" if the normal sample size is one hundred sixteen (116) IC devices. On the other hand, if the number of actually failed devices is five or less, the normal sampling test is performed (step 178).

At step 164 it is determined if there is a data error, for example, if there is no information about the lot or a lot size equal to zero. When an error is found in step 164, the normal sampling test is performed (step 178). If no data error is present, at step 166 it is determined if the number of devices in the incoming inspection requested lot is incorrect, indicating that the actual good or passed IC devices which were counted personally by an operator are not identical to the good devices contained in the test result data. This situation also requires the normal sampling test to be performed in step 178. At step 168, it is determined if the yield is greater than or equal to 80% and less than 95%, and if so, the normal sampling test is also performed.

At step 170, it is determined if any bin category quantity exceeds the bin category limits, and if so, if the bin category quantity is greater than 3% of the lot size in step 174. When the bin category quantity is greater than 3% of the lot size, it is assumed that the quality of the IC devices is not reliable even if the yield requirement is met, and the normal sampling test and a production reliability test are performed in step 180. In the production reliability test, the IC devices are re-tested under stricter test conditions, e.g., by thermally and electrically stressing the IC devices. If the lot does not pass the production reliability test, the lot cannot be shipped. If the bin category quantity exceeding the bin category limit is less than 3%, then the normal sampling test is performed.

Note that in step 174, the BIN 19 and 20 categories, corresponding to open/short failures, are excluded because the open/short failures are not related to the electrical characteristics of the IC devices and instead are due to contact failures between package leads of the IC devices and a test board, between the test board and a handler, or due to a wire bonding failure, as explained above. Further, these contact failures have been detected in a prior test sequence monitoring step.

If the lot passes through all the lot decision items (steps 162, 164, 166, 168 and 170), this lot can be delivered to a customer without performing the sampling test (step 182). In other words, IC devices passing through step 182 were only subjected to the final test, and not the conventional quality assurance test. Generally, the lots which pass through step 182 and skip the quality assurance test amount to half of the IC devices produced. As a result, according to the present invention, the productivity of the test process can be greatly improved and manpower and equipment for the sampling test can be saved.

Figure 12:
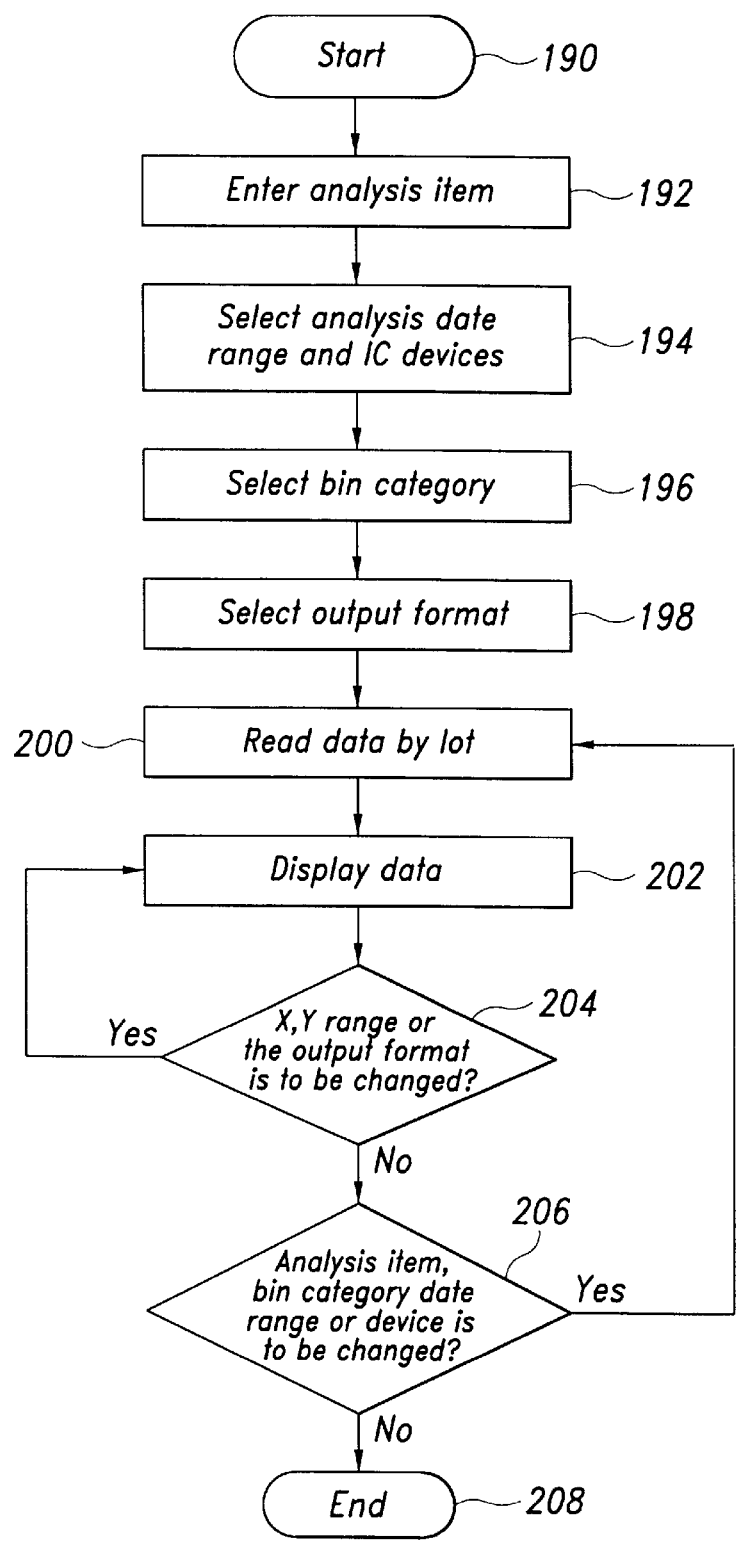
FIG. 12 is a flow diagram of a data analysis sequence tool of the present invention.

FIG. 12 is a flow diagram of a data analysis sequence tool of the present invention. The data analysis tool is used to trace the causes of failures, so as to statistically manage and control the production yield and device quality by utilizing the test data generated during the test process. To be effective, it is important that the data analysis tool allow the analyzer or the operator to see large amounts of test data on one screen.

In the start step 190, a user interface (e.g., initial screen) is displayed on the monitor of the distributed computers 16 for communication between the user and the distributed computer 16. The operator enters analysis items through a keyboard or a mouse (step 192), and the analysis items are used to analyze the test data by lot, date, operators, month, test line, and bin categories. The operator enters an analysis term or date range (year/month/day format), and an IC device name to select the analysis date range and IC device to be analyzed (step 194) and to choose the bin category (step 196). A plurality of bin categories can be chosen simultaneously.

The operator can select an output format, e.g., a bar graph or a line graph (step 198), and the distributed computer 16 reads out the test data of the chosen lot within the selected test term or date range from the host computer 14 (step 200). The distributed computer 16 transforms the test data read from the host computer 14 into the selected graphic format and outputs them through the display unit (step 202).

When the operator wants to change the ranges of X-axis and Y-axis of the graphical test data or to change the output format (step 204), the operator inputs the desired change and then the distributed computer 16 transforms and displays the test data accordingly (step 202). Meanwhile, when the operator wants to change the analysis items, bin category, the analysis date range, or IC devices to be analyzed (step 206), the operator inputs the requested change, and then the distributed computer 16 reads out the test data under the changed condition from host computer 14 (step 200) and displays the test data in graphic format (step 202).

Figure 13:
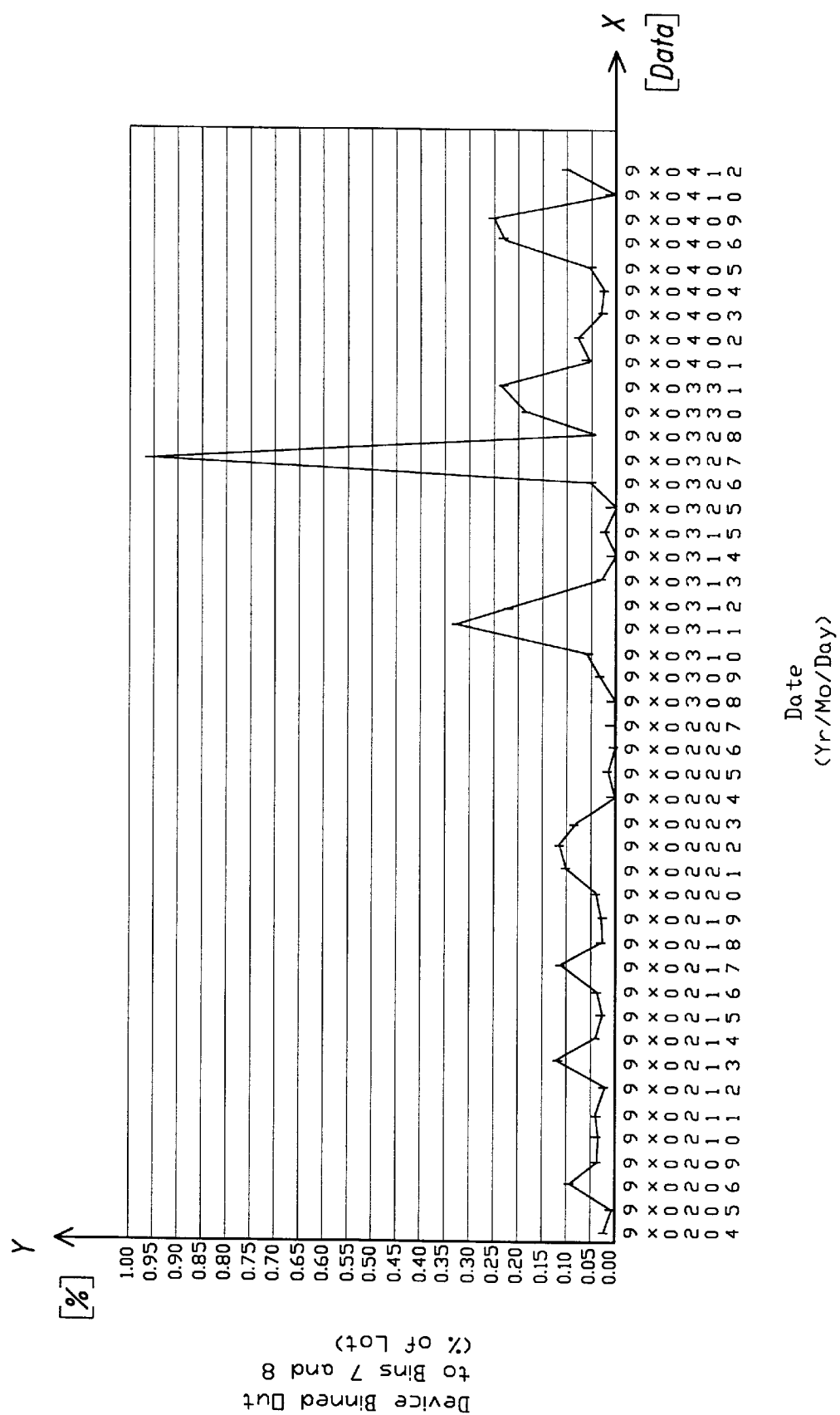
FIG. 13 illustrates a graphical example of actual results of the data analysis sequence tool of the present invention.

FIG. 13 illustrates a graphical example of the actual results of the output of the data analysis tool of the present invention, displayed in a line graph form. The graph of FIG. 13 shows the variations of the test results of BINs 7 and 8, which are related to leakage currents of an IC device. The numerals along the X-axis denote the date, for example, '9×0204' means Feb. 2, 199x. The Y-axis shows the quantity of IC devices binned out into bin categories 7 and 8 (BINs 7 and 8) as a percentage of lot size.

As shown in FIG. 13, the IC devices had leakage current failures exceeding 0.3% of the lot size on Mar. 11, 199x, which is much greater than the average value of 0.046% for the previous period (from February 4 to March 10). The main cause of leakage current failure is an overlap of gate contact. In looking for an explanation for the changes in the gate contact process depicted in the graph after Mar. 11, 199x, the operators discovered a problem with a newly purchased machine for forming the gate contact.

Although the graph in FIG. 13 is directed to data for BINs 7 and 8, this actual example demonstrates that the present invention provides an early warning and pinpoints the source of any problem in the previous wafer fabrication process and the assembly process. The above analysis of the test data can be applied to any bin category. In addition, because the accumulated test data are used in the analysis, it is possible to continuously observe the variation in previous processing steps, and the ability to detect an abnormal lot is greatly improved.

While this invention has been described with reference to an illustrative embodiment, this description is not intended to be construed in a limiting sense, and it will be appreciated that various modifications and alterations might be made by those skilled in the art without departing from the spirit and scope of the present invention. In particular, one skilled in the art will recognize that the present invention may be applied to a burn-in test and an Electrical Die Sorting (EDS) test. The burn-in test is used to screen out weak IC devices by thermally and electrically stressing the IC devices to accelerate the early failure mechanism. Some bin categories are related to the early failure mechanism, and hence the failure ratio of these bin categories can be used to analyze the burn-in test result. By using the bin category test results together with the burn-in test, it is possible to reduce the burn-in test time, and even to omit the burn-in test.

The EDS test marks rejected chips on a wafer so that the failed chips are excluded from the assembly processes. The bin category test results obtained after performing the final test can also be used to define failure limits of the EDS test.

What is claimed is:

1. A method of specifying quality assurance testing of integrated circuit devices, said method comprising the steps of:

loading a tester with a test program, and identifying IC devices to be tested by the tester by lot;

testing each of the IC devices of a said lot under a plurality of test sequences, and sorting the IC devices of the lot into bin categories according to results of the test sequences, the test sequences each defining a pass or fail standard for the IC devices;

monitoring progress of the testing of the lot of IC devices, while storing test result data indicative of the results of the test sequences;

establishing limits for each of the bin categories;

when the testing and sorting is completed, making a lot decision governing a subsequent test flow path of a tested lot by using the stored test result data and the bin category limits, said making of the lot decision including determining whether the lot meets a yield requirement of the test sequences;

storing the test result data in different memory locations in a computer in accordance with the lot decision, and displaying the lot decision; and executing quality assurance test decisions when the lot meets the yield requirement, said quality assurance test decisions including:

if the tested lot has a quantity of IC devices exceeding the bin category limits, which quantity is equal to or greater than a predetermined number, then performing both a sampling test and a production reliability test on IC devices in the lot which have passed the test sequences, if the tested lot has a quantity of IC devices exceeding the bin category limits, which quantity is less than the predetermined number, then performing only the sampling test only on the IC devices in the lot which have passed the test sequences, and if the tested lot has no IC devices exceeding the bin category limits, then omitting the sampling test and the production reliability test.

2. The method as claimed in claim 1, wherein said monitoring of the progress of the testing of the lot of IC devices comprises analyzing data structures resident in the memory of the computer to make a determination of whether the testing of the IC devices is progressing normally according to predetermined criteria, the data structures containing data representing a tester name, a lot test start time, a lot size of IC devices, a total count of IC devices, a quantity of failed IC devices, a quantity of passed IC devices, a quantity of devices experiencing open/short failures, and a quantity of devices experiencing failures other than open/short failures; and producing an alarm message if analysis of the data structures determines that the testing of the IC devices is not progressing normally, otherwise, continuing the testing and sorting of the IC devices.

3. The method as claimed in claim 1, wherein the making of the lot decision and the storing of the test result data according to the lot decision comprises:

determining whether a yield of IC devices is equal to or greater than a predetermined value, and if not, storing the test result data into a no-go database;

determining if the yield exceeds 100% when the yield is equal to or greater than the predetermined value, and if so, storing the test result data into the no-go database and repeating said testing of the lot of IC devices;

if the yield is less than 100% but equal to or greater than the predetermined value, determining if there are any bin categories having their bin category limits exceeded;

storing the test result data into the no-go database and requesting an incoming inspection when any bin categories having their bin category limits exceeded are found; and storing the test result data into a go database and requesting an incoming inspection when no bin categories exceeding their bin category limits are found.

4. The method as claimed in claim 1, wherein the making of the lot decision and the storing of the test result data in accordance with the lot decision comprises:

determining whether a yield of IC devices is equal to or greater than a predetermined value, and if not, storing the test result data into a no-go database;

determining if the yield exceeds 100% when the yield is equal to or greater than the predetermined value, and if so, storing the test result data into the no-go database and performing a sampling test;

if the yield is less than 100% but equal to or greater than the predetermined value, determining if there are any bin categories having their bin category limits exceeded;

storing the test result data into the no-go database and requesting an incoming inspection when any bin categories having their bin category limits exceeded are found; and storing the test result data into a go database and requesting an incoming inspection when no bin categories having their bin category limits exceeded are found.

5. The method as claimed in claim 1, wherein the executing of quality assurance test decisions further comprises: determining if the quantity of IC devices which have failed the test sequences is equal to or less than a second predetermined number when the yield exceeds 100%, and if so, performing a sampling test of a sample quantity of IC devices in the lot which have passed the test sequences, otherwise, repeating the test sequences on the IC devices.

6. The method as claimed in claim 1, wherein the establishing of the limits of the bin categories comprises:

testing a predetermined number of lots of IC devices and then calculating an average number 'P' of IC devices sorted into each of the bin categories during the testing;

calculating a standard deviation '$\sigma=\sqrt{P(1-P)/n}$' by using the average 'P' and a lot size 'n';

determining if the average 'P' is equal to or less than a first reference value;

determining if 'P+3σ' is equal to or less than a second reference value when the average 'P' is equal to or less than the first reference value, and determining if the average 'P' is equal to or less than a third reference value when the average 'P' exceeds the first reference value;

setting a bin category limit as 'P+3σ' when 'P+3σ' exceeds the second reference value when the average 'P' is equal to or less than the first reference value, setting a bin category limit as the second reference value when 'P+3σ' is equal to or less than the second reference value when the average 'P' is equal to or less than the first reference value, and setting a bin category limit as 'P+2σ' when the average 'P' exceeds the first reference value and is equal to or less than the third reference value;

determining if the average 'P' is equal to or less than a fourth reference value when the average 'P' exceeds the third reference value;

setting a bin category limit as 'P+σ' when the average 'P' is equal to or less than the fourth reference value when the average 'P' exceeds the third reference value;

determining if the average 'P' is equal to or less than a fifth reference value when the average 'P' exceeds the fourth reference value; and setting a bin category limit as the average 'P' when the average 'P' is equal to or less than the fifth reference value when the average 'P' exceeds the fourth reference value, and setting no bin category limit when the average 'P' exceeds the fifth reference value, wherein the second reference value is less than the first reference value, the third reference value is greater than the first reference value, the fourth reference value is greater than the third reference value, and the fifth reference value is greater than the fourth reference value.

7. The method as claimed in claim 6, wherein the first reference value is 0.3% of the lot size and the second reference value is 0.2% of the lot size.

8. The method as claimed in claim 1, wherein the executing of quality assurance test decisions further comprises: determining if the quantity of failed IC devices is equal to or less than a second predetermined number when the yield exceeds 100%, and if so, performing a sampling test of a first quantity of devices in the lot which have passed the test sequences, otherwise, performing a sampling test of a second quantity of IC devices in the lot which have passed the test sequences, the second quantity being twice the first quantity.

9. The method as claimed in claim 8, wherein the predetermined number is 5.

* * * * *